PLASTIC MOUNTING CLIP FOR ELECTRICAL CIRCUIT COMPONENT

Filed Sept. 6, 1966

ROSS W. GIFFORD
*INVENTOR*

BY
*BUCKHORN, BLORE, KLARQUIST & SPARKMAN*
*ATTORNEYS*

United States Patent Office | 3,439,227
Patented Apr. 15, 1969

3,439,227

PLASTIC MOUNTING CLIP FOR ELECTRICAL CIRCUIT COMPONENT

Ross W. Gifford, Portland, Oreg., assignor to Tektronix, Inc., Beaverton, Oreg., a corporation of Oregon Filed Sept. 6, 1966, Ser. No. 577,329
Int. Cl. H02b *1/04;* H01r *13/54*
U.S. Cl. 317—101 11 Claims

ABSTRACT OF THE DISCLOSURE

A mounting apparatus for electrical circuit components is described in which a clip member of plastic material having diodes or other components mounted thereon is employed to removably attach such diodes to a printed circuit board. The clip member has a pair of resilient gripping elements which are normally biased closed to hold the printed circuit board therebetween and are provided with cam portions for opening such elements during insertion and removal. A diode is mounted on each gripping element for movement therewith so that the leads of such diode make and break connections with contacts on the printed circuit board when the clip member is inserted into and removed from a mounting slot provided in such board.

The subject matter of the present invention relates generally to mounting apparatus for electrical circuit components, and in particular to a plastic mounting clip for attaching diodes or other components into a slot provided in a printed circuit board.

While the apparatus of the present invention is especially useful for mounting diodes which form the signal sampling gate employed in a sampling type of cathode ray oscilloscope, the present mounting clip may also be used to attach integrated circuits, transistors, capacitors and other electrical circuit components to printed circuit boards. If the circuit component has more than two terminals, the mounting clip must be modified slightly to provide sufficient room to enable a plurality of leads to be attached to each side of the gripping elements of such clip, and the printed circuit board may be changed to provide a plurality of conductors on each side of the access slot in such printed circuit board if such leads are to be insulated from each other.

Briefly, one embodiment of the mounting apparatus of the present invention includes a plastic mounting clip having a pair of separate, resilient gripping elements for attaching such clip to a printed circuit board between such gripping elements. A pair of diodes are secured to different ones of the gripping elements by bending its leads about such gripping elements. The front end of each of the gripping elements is provided with a pair of cam portions, and a guide portion between such cam portions which is inserted into an acces slot in the printed circuit board to guide the movement of the clip to a locked position. In the locked position the cam portions are inserted into a locking slot extending across the rear end of the access slot which enables the gripping elements to spring together and clamp the printed circuit board between such gripping elements. During insertion and removal of the mounting clip, the cam portions engage the opposite sides of the printed circuit board to space the diode leads away from such circuit board to prevent damage to such diodes, but such cam surfaces move inwardly toward each other when they are inserted into the locking slot, thereby causing the diode leads to engage conductors provided on the opposite sides of the access slot.

The mounting apparatus of the present invention has several advantages over that previously employed including quick insertion and removal of the electrical components from a printed circuit board without any time consuming soldering operations which may damage such components or the printed circuit board. In addition, when the mounting clip is used for attaching the diodes of a sampling gate, the resulting mounting apparatus has less inductance and capacitance so that input signals of higher frequency may be sampled successfully. Also the electrical balance of the diode sampling gate may be checked merely by removing the mounting clip, rotating it 180° and reinserting it into the access slot of the printed circuit board. Extremely small electrical components, such as sampling diodes, may be shipped to the consumer within the mounting clip so that they are preassembled with the proper polarity to elminate any handling and testing of the diodes by the customer, which may damage the diodes. As stated previously, the leads of the electrical components receive clamping pressure only when they are in the locked position and not during insertion or removal, which prevents damage to the components. Furthermore, the locking action of the cam portions and the stop edge at the front of the guide portion insures that the electrical components are accurately positioned on the printed circuit board automatically. Also by employing an access slot which opens at the edge of the printed circuit board it is possible to make a "blind" insertion of the mounting clip deep inside an electrical instrument, thereby permitting greater design flexibility. The mounting clip is made out of two identical parts of molded plastic material which are fused together ultrasonically, so that conventional molding techniques can be employed to reduce production cost.

It is therefore one object of the present invention to provide an improved mounting apparatus for an electrical circuit component in which a mounting clip is employed for mechanical attachment of the component to a printed circuit board or other support.

Another object of the present invention is to provide an improved mounting apparatus for electrical circuit components which enables such components to be quickly and easily attached into a slot in a printed circuit board.

A further object of the present invention is to provide a mounting clip for mechanically attaching an electrical circuit component to a printed circuit board without soldering to prevent damage to such circuit component.

An additional object of the present invention is to provide a plastic clip for mounting a circuit component on a printed circuit board by means of a strong mechanical connection capable of withstanding shock and vibration and having a long useful lifetime.

Still another object of the present invention is to provide an improved mounting apparatus in which a plastic mounting clip and a printed circuit board having an edge opening access slot are employed to attach electrical circuit components to such printed circuit board at a precise location quickly and easily and, if necessary, by a blind installation at an inaccessible location deep within an electrical instrument.

A still further object of the present invention is to provide a plastic clip for attaching an electrical circuit component, which is inexpensive and may be employed as the package within which the components are shipped to enable such components to be preassembled with the proper orientation to reduce the possibility of loss or damage to the components due to handling by the customer.

Other objects and advantages of the present invention will be apparent from the following detailed description of a preferred embodiment thereof and from the attached drawings of which:

Figure 1:
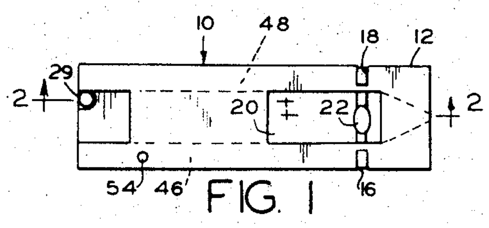
FIG. 1 is a plan view of the top of the mounting clip of the present invention.
Figure 2:
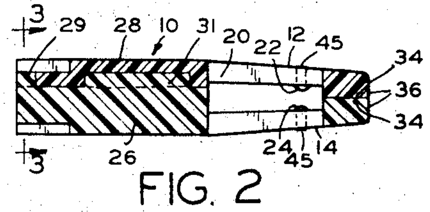
FIG. 2 is a horizontal section view taken along the line 2—2 of FIG. 1.
Figure 4:
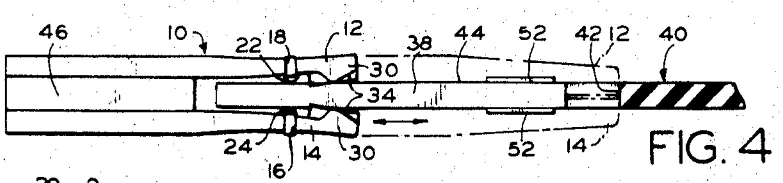
FIG. 4 is a plan view of the side of the mounting clip of FIG. 1 shown by solid lines partially inserted into the access slot of a printed circuit board and shown by phantom lines fully inserted into a locked position, with a portion of such printed circuit board broken away for clarity.

As shown in FIGS. 1 and 2, a mounting clip 10 made in accordance with the present invention is provided with a pair of resilient gripping elements 12 and 14 extending from the front of such clip. Each of the gripping elements has a pair of grooves 16 and 18 in the outer surfaces of their side portions and an opening 20 through the element between such side portions, to enable a pair of diodes 22 and 24 to be supported on different ones of such gripping elements within such opening by bending the leads of such diodes about such gripping elements into such grooves. The diodes 22 and 24 may be low charge storage, fast switching, PN junction diodes used in the sampling gate of a sampling type cathode ray oscilloscope. The diodes are positioned partially within the openings 20 of the gripping elements 12 and 14 and outwardly of the innermost surface of the gripping elements so that such diodes do not rub on the printed circuit board during insertion or removal, as hereafter described and as shown in FIG. 4, and do not touch each other in the relaxed position of the gripping elements shown in FIG. 2.

Figure 3:
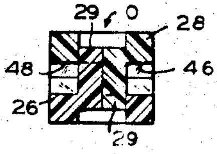
FIG. 3 is a vertical section view taken along the line 3—3 of FIG. 2.

The mounting clip 10 is formed of two identical pieces 26 and 28 of molded plastic material such as the polyoxymethylene acetal resin sold under the trademark "Delrin" by Du Pont de Nemours & Company which are fused together along a longitudinal axis by ultrasonic heating to provide a clip about .888 inch long by .225 inch wide by .189 inch thick. Before fusion the two clip halves 26 and 28 are temporarily snapped together by tabs 29 and 31 which extend into corresponding openings in the rear and intermediate portions of the other clip half, as shown in FIGS. 2 and 3.

Figure 5:
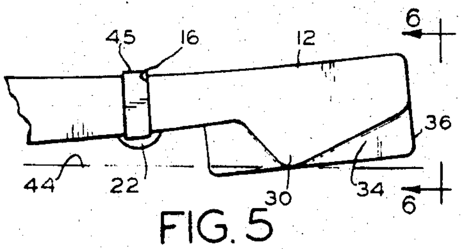
FIG. 5 is an enlarged view of the front end of one gripping element of the mounting clip of FIG. 4.
Figure 6:
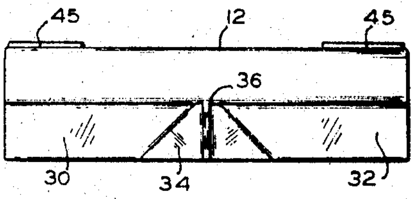
FIG. 6 is a plan view taken along the line 6—6 of FIG. 5.

As shown in FIGS. 5 and 6, each of the gripping elements 12 and 14 includes a pair of cam portions 30 and 32 and a guide portion 34 between such cam portions provided at the free end of the gripping element. The guide portion 34 is of a wedge shape having a front edge 36 which guides the clip into an access slot 38 extending from the outer edge of a printed circuit board 40 to a locking slot 42 in such board extending across the rear end of such access slot. In addition, the front edge 36 of the guide portion 34 also acts as a stop when the mounting clip is inserted fully into the locked position shown in FIG. 7, since such front edge engages the edge of the locking slot 42. The guide portion 34 has a cross section parallel to the printed circuit board which is in the shape of a triangle and extends rearwardly slightly further than the cam portions 30 and 32.

During insertion or removal as shown in the solid lines of FIG. 4, the cam portions 30 and 32 engage the surface of the printed circuit board represented by phantom line 44 in FIG. 5, and the rear end of the guide portion extends into the access slot 38 below the surface of the printed circuit board due to bending of the gripping element to guide insertion or removal. As a result the diodes 22 and 24 are held spaced from the printed circuit board during insertion and removal by the cam portions 30 acting as spacers to prevent damage to the diodes at this time. The leads 45 of the diodes extend across the inner surface of the gripping elements 12 and 14 slightly behind the cam portions 30 and are bent outward into grooves 16 and 18 around the gripping elements and along the outer surface of such gripping elements in order to hold the diodes in position on the clip. In addition, pressure sensitive adhesive tape (not shown) may be applied on the outer surface of the gripping elements 12 and 14 over the diode leads to aid in attaching the diodes to the clip. This tape also electrically insulates such leads to prevent damage to the diodes due to electrostatic discharge during handling.

Figure 8:
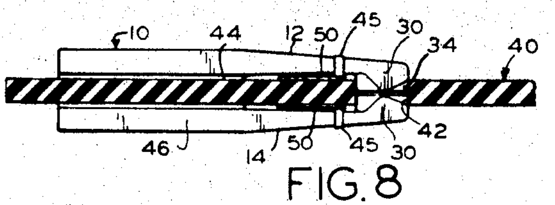
FIG. 8 is a horizontal section view taken along the line 8—8 of FIG. 7.
Figure 7:
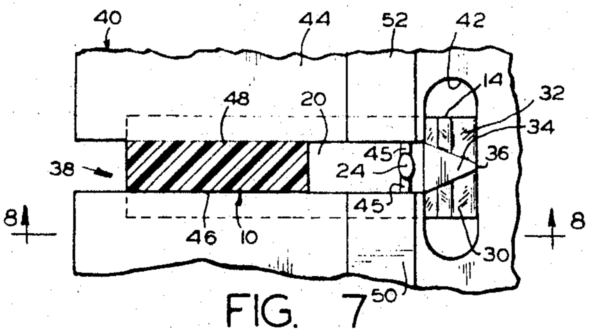
FIG. 7 is a plan view of the top of the mounting apparatus of FIG. 4 with the mounting clip in the locked position and with the top portion of the mounting clip broken away for clarity.

As shown in FIG. 4, the mounting clip 10 is provided with a pair of guide grooves 46 and 48 which extend longitudinally along the opposite sides of the clip from the rear of the clip to the start of the gripping elements. These guide grooves help guide the movement of the clip during insertion and removal and prevent lateral movement in the locked position in a direction generally perpendicular to the printed circuit board, by engagement with the edges of the access slot 38. When the clip is moved from the position shown in solid lines to the locked position shown by phantom lines in FIG. 4, the cam portions 30 move along the surfaces of the printed circuit board 40 on the opposite sides of the access slot 38 and into the locking slot 42, as shown in FIGS. 7 and 8 due to the resiliency of the gripping elements. It should be noted that during the manufacture of the clip 10 the gripping elements 12 and 14 are formed so that their guide portions 34 normally touch to provide the tension force necessary to hold the clip in the locked position. After aging at a predictable rate for approximately three years, the tensile strength of polyoxymethylene acetal resin is reduced from an initial value of 10,000 p.s.i. approximately 50 percent to about 5000 p.s.i. As a result the gripping elements 12 and 14 retain over a long useful lifetime much of their resiliency and holding power, which is not true of other plastics due to their greater cold flow tendency.

As stated previously, during insertion and removal of a mounting clip the cam portions 30 and 32 space the diode leads from the surface of the printed circuit board. When the clip is moved into the locked position of FIGS. 7 and 8 the cam portions slide into the locking slot 42 to enable the gripping elements 12 and 14 to spring together, thereby causing the diode leads 45 to engage conductors 50 and 52 formed as thin layers of copper or other metal on the surface of the plastic insulator body of the printed circuit board. The conductors 50 and 52 extend away from the opposite sides of the access slot 38 adjacent the locking slot 42, and are provided on both the top and bottom surfaces of the printed circuit board to provide connections for both of the diodes 22 and 24. Also it should be noted that the rear surfaces of the cam portions 30 and 32 engage the edge of the locking slot 42 on opposite sides of the access slot 38, while the front edge 36 of the guide portion 34 engages the other side of the locking slot in order to securely lock the clip in position.

A polarity dot 54 of colored paint may be provided within a small hole on the surface of the clip to indicate the relative positions of the anode and cathode of the diodes. Also as indicated above, a plurality of diodes, a transistor or an integrated circuit may be mounted in place of the diodes shown on each of the gripping elements, in which case a plurality of leads may extend from each side of the gripping elements to engage a corresponding number of conductors provided in spaced insulated relationship on the printed circuit board in place of conductors 50 and 52.

It will be obvious to those having ordinary skill in the art that many changes may be made in the details of the above-described preferred embodiment of the present invention, without departing from the spirit of the invention. Therefore the scope of the present invention should only be determined by the following claims.

I claim:

1. Mounting apparatus for an electrical circuit component, comprising:

a clip member of electrical insulating material having a pair of separate, resilient gripping elements for attachment of the clip to a support between said gripping elements; and mounting means provided on said clip member for mounting at least one electrical circuit component on said clip member so that the leads of said component move with said gripping elements to make and break connections directly with electrical contacts on said support.

2. Mounting apparatus in accordance with claim 1 in which the clip member and gripping elements are of plastic material and which also includes a plurality of circuit components mounted on said gripping elements and a printed circuit board attached to the clip member between the gripping elements, as the support.

3. Mounting apparatus in accordance with claim 2 in which the gripping elements each include a pair of cam portions and a guide portion between said cam portions at the free end of the gripping element, said cam and guide portions extending inwardly and positioned so that when the guide portions are inserted into an access slot in the printed circuit board the cam portions engage the top and bottom surfaces of said printed circuit board on the opposite sides of the slot to bend the gripping elements outward.

4. Mounting apparatus in accordance with claim 3 in which the printed circuit board also has a locking slot which extends across the rear end of the access slot to enable the cam portions of the gripping elements to move inward into said locking slot when the guide portions engage the wall of said locking slot in order to lock the clip member in position.

5. Mounting apparatus in accordance with claim 4 in which the mounting means positions the leads of the circuit component so that said leads are spaced out of engagement with the printed circuit board by the cam portions during insertion and removal of the clip member, and said leads are in engagement with conductors on said printed circuit board in the locked position of said clip member.

6. Mounting apparatus in accordance with claim 2 in which the circuit components are a pair of diodes each attached to a different gripping element of the clip member with its leads extending to the opposite sides of said gripping element and mechanically secured thereto.

7. Mounting apparatus in accordance with claim 1 in which the clip member is made of acetal resin plastic.

8. Mounting apparatus in accordance with claim 1 in which the clip member is formed of two similar parts of plastic material fused together along its longitudinal axis, each including a different one of the gripping elements.

9. Mounting apparatus in accordance with claim 3 in which the clip member has a pair of guide grooves extending longitudinally along the sides of said clip member for receiving the two edges of the printed circuit board on the opposite sides of the access slot.

10. Mounting apparatus in accordance with claim 4 in which the guide portion is of a wedge shape having a front edge which guides the clip member into the access slot and engages the wall of the locking slot as a stop.

11. Mounting apparatus in accordance with claim 7 in which the acetal resin is polyoxymethylene.

References Cited

UNITED STATES PATENTS

| | | |
|---|---|---|
| 2,701,346 | 2/1955 | Powell. |
| 3,334,325 | 8/1967 | Conrad et al. |
| 3,372,308 | 3/1968 | Noschese et al. |

LEWIS H. MYERS, *Primary Examiner.*

J. R. SCOTT, *Assistant Examiner.*

U.S. Cl. X.R.

339—91